(12) United States Patent  
Willwerth et al.

(10) Patent No.: US 8,757,603 B2
(45) Date of Patent: Jun. 24, 2014

(54) LOW FORCE SUBSTRATE LIFT

(75) Inventors: Michael D. Willwerth, Campbell, CA (US); David Palagashvili, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 703 days.

(21) Appl. No.: 12/910,542

(22) Filed: Oct. 22, 2010

(65) Prior Publication Data
US 2012/0097908 A1    Apr. 26, 2012

(51) Int. Cl.
*B23P 19/00* (2006.01)

(52) U.S. Cl.
USPC ............................................ 269/21; 269/900

(58) Field of Classification Search
USPC ....................... 269/21, 20, 903, 900
See application file for complete search history.

(56) References Cited

U.S. PATENT DOCUMENTS

| | | | |
|---|---|---|---|
| 6,241,825 B1 * | 6/2001 | Wytman | 118/733 |
| 6,305,677 B1 * | 10/2001 | Lenz | 269/13 |
| 6,389,677 B1 * | 5/2002 | Lenz | 29/559 |
| 6,439,559 B1 * | 8/2002 | Kinnard et al. | 269/21 |
| 7,469,886 B2 * | 12/2008 | Shen et al. | 269/21 |
| 2009/0250855 A1 * | 10/2009 | Fujii et al. | 269/21 |
| 2010/0133735 A1 * | 6/2010 | Katsuta | 269/21 |
| 2012/0097908 A1 * | 4/2012 | Willwerth et al. | 254/93 R |

* cited by examiner

*Primary Examiner* — Lee D Wilson
(74) *Attorney, Agent, or Firm* — Moser Taboada; Alan Taboada

(57) ABSTRACT

Apparatus for lifting substrates from substrate supports are provided herein. In some embodiments, a substrate lift may include: a substrate support having a plurality of lift pins movably disposed through the substrate support to selectively raise and lower a substrate; an actuator coupled to the plurality of lift pins to control the position of the plurality of lift pins, wherein the actuator has a first port for receiving air at a first pressure to cause the actuator to extend the plurality of lift pins and a second port for receiving air at a second pressure to cause the actuator to retract the plurality of lift pins; and a pressure regulator coupled to the actuator to reduce the first pressure to a magnitude that is less than that of the second pressure.

19 Claims, 4 Drawing Sheets

LOW FORCE SUBSTRATE LIFT

FIELD

Embodiments of the present invention generally relate to substrate processing.

BACKGROUND

Conventional substrate processing typically includes providing one or more substrates to a substrate support disposed within a process chamber. The substrate may be secured in place (i.e., chucked) during processing via, for example, an electrostatic force. After processing, the substrate may be lifted from the substrate support by a substrate lift comprising a plurality of lift pins. The substrate lift is typically pneumatically actuated by an actuator coupled to a common air supply that is used to operate various process chamber components.

The inventors have provided an improved substrate lift that reduces or eliminates the risk of damage to the substrate during substrate lifting operations.

SUMMARY

Apparatus for lifting substrates from substrate supports are provided herein. In some embodiments, a substrate lift may include: a substrate support having a plurality of lift pins movably disposed through the substrate support to selectively raise and lower a substrate; an actuator coupled to the plurality of lift pins to control the position of the plurality of lift pins, wherein the actuator has a first port for receiving air at a first pressure to cause the actuator to extend the plurality of lift pins and a second port for receiving air at a second pressure to cause the actuator to retract the plurality of lift pins; and a pressure regulator coupled to the actuator to reduce the first pressure to a magnitude that is less than that of the second pressure.

In some embodiments, a process chamber may include a substrate support disposed within the process chamber for supporting a substrate and a substrate lift coupled to the substrate support, the substrate lift may include: a plurality of lift pins movably disposed through the substrate support to selectively raise and lower the substrate; an actuator coupled to the plurality of lift pins to control the position of the plurality of lift pins, wherein the actuator has a first port for receiving air at a first pressure to cause the actuator to extend the plurality of lift pins and a second port for receiving air at a second pressure to cause the actuator to retract the plurality of lift pins; and a pressure regulator coupled to the actuator to reduce the first pressure to a magnitude that is less than that of the second pressure.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
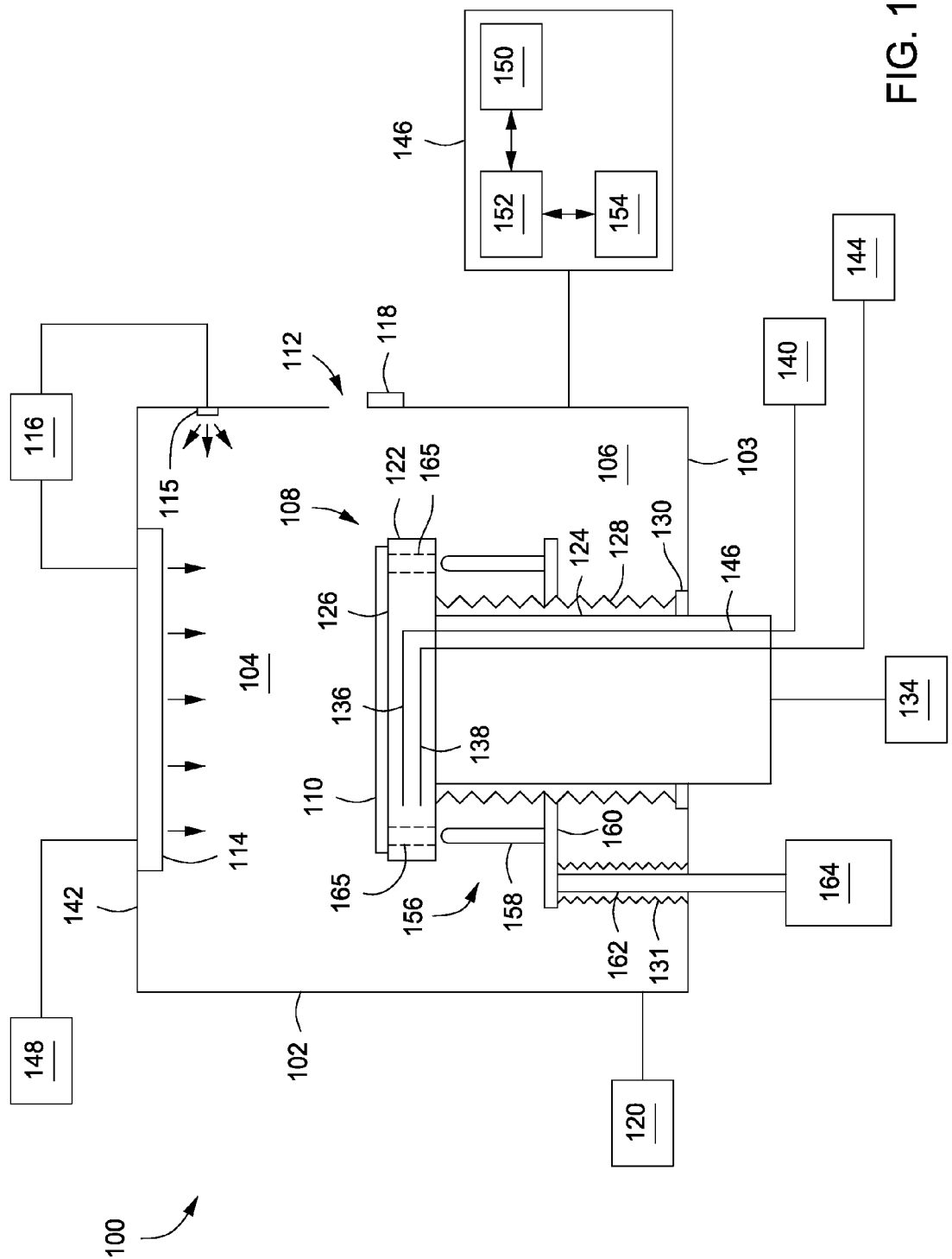
FIGS. 1 and 2 depict a process chamber suitable for use with a substrate lift in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate lifts are provided herein. The inventors have observed that in instances where the substrate sticks to, or binds, to the substrate support, the pressure provided by the factory air supply used in conventional substrate lift systems may cause an excessive amount force to be exerted on the substrate via the lift pins, which may result in damage to the substrate. The inventors have provided embodiments of an improved substrate lift apparatus that may advantageously use a lower force that limits or prevents damage to a substrate caused by excessive force applied to the substrate via the lift pins.

FIG. 1 depicts a process chamber 100 suitable for use with a substrate lift according to embodiments of the present invention. Exemplary process chambers may include the PRODUCER®, DPS®, ENABLER®, SIGMA™, ADVANTEDGE™, or other process chambers, available from Applied Materials, Inc. of Santa Clara, Calif. It is contemplated that other suitable chambers include any chambers that may be used to perform any substrate fabrication process, including chambers from other manufacturers.

In some embodiments, the process chamber 100 generally comprises a chamber body 102 defining an inner processing volume 104 and an exhaust volume 106. The inner processing volume 104 may be defined, for example, at least between a substrate support 108 disposed within the process chamber 100 for supporting a substrate 110 thereupon during processing and one or more gas inlets, such as a showerhead 114 and/or nozzles 115 provided at desired locations. The exhaust volume 106 may be defined, for example, between the substrate support 108 and a bottom 103 of the chamber body 102.

The substrate 110 may enter the process chamber 100 via an opening 112 in the chamber body 102. The opening 112 may be selectively sealed via a slit valve 118, or other mechanism for selectively providing access to the interior of the process chamber 100 through the opening 112. The substrate support 108, described more fully below, may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

The one or more gas inlets (e.g., nozzles 115 and/or showerhead 114) may be coupled to a gas supply 116 for providing one or more process gases into the processing volume 104 of the process chamber 100. Although a showerhead 114 and nozzles 115 are shown, additional or alternative gas inlets may be provided such as nozzles or inlets disposed in the ceiling or on the sidewalls of the process chamber 100 or at other locations suitable for providing gases as desired to the process chamber 100, such as the base of the process chamber, the periphery of the substrate support, or the like.

In some embodiments, one or more plasma power sources (one RF power source 148 shown) may be coupled to the process chamber 102 through one or more matching networks (not shown) for providing power for processing. In some embodiments, the process chamber 100 may utilize capacitively coupled RF power provided to an upper electrode proximate an upper portion of the process chamber 100. The upper electrode may be a conductor in an upper portion of the chamber body 102 or formed, at least in part, by one or more of the ceiling 142, the showerhead 114, or the like, fabricated from a suitable conductive material. For example, in some embodiments, the one or more plasma sources (e.g., RF power source 148) may be coupled to a conductive portion of the ceiling 142 of the chamber body 102 or to a conductive portion of the showerhead 114. The ceiling 142 may be substantially flat, although other types of ceilings, such as dome-shaped ceilings or the like, may also be utilized. Alternatively, the one or more RF power sources may be coupled to inductive coil elements (not shown) disposed proximate the ceiling of the process chamber 102 to form a plasma with inductively coupled RF power.

In some embodiments, the process chamber 100 is coupled to and in fluid communication with a vacuum system 120, which may include a throttle valve (not shown) and vacuum pump (not shown) which are used to exhaust the process chamber 100. The pressure inside the process chamber 100 may be regulated by adjusting the throttle valve and/or vacuum pump.

To facilitate control of the process chamber 100, a controller 146 may be provided. The controller 146 may be one of any form of general-purpose computer processor that can be used in an industrial setting for controlling various chambers and sub-processors. The memory, or computer-readable medium 150 of the CPU 152 may be one or more of readily available memory such as random access memory (RAM), read only memory (ROM), floppy disk, hard disk, or any other form of digital storage, local or remote. The support circuits 154 are coupled to the CPU 152 for supporting the processor in a conventional manner. These circuits include cache, power supplies, clock circuits, input/output circuitry and subsystems, and the like.

The substrate support 108 may be disposed within the inner processing volume 104 for supporting the substrate 110. The substrate support 108 generally comprises a body 122 having a substrate support surface 126 for supporting a substrate 110 thereon. The body 122 may be supported by a support shaft 124. In some embodiments, the support shaft 124 is hollow and provides a conduit to provide process gases, fluids, heat transfer fluids, power, or the like, to the substrate support 108. In some embodiments, the substrate support 108 may include a mechanism that retains or supports the substrate 110 on the surface of the substrate support 108, such as an electrostatic chuck, a vacuum chuck, a substrate retaining clamp, or the like.

In some embodiments, the substrate support 108 may include an RF bias electrode 138. The RF bias electrode 138 may be coupled to one or more bias power sources (one bias power source 144 shown) through one or more respective matching networks (not shown). The one or more bias power sources bias power may provide either continuous or pulsed power. In some embodiments, the bias power source may be a DC or pulsed DC source.

In some embodiments, the substrate support 108 may include one or more mechanisms for controlling the temperature of the substrate support surface 126 and the substrate 110 disposed thereon. For example, one or more channels 136 may be provided to define one or more flow paths beneath the substrate support surface 126 to flow a heat transfer fluid. A heat transfer fluid source 140 may be coupled to the one or more channels 136 via a conduit 146 to provide the heat transfer fluid to the one or more channels 136. The heat transfer fluid source 140 may comprise a temperature control device, for example a chiller or heater, to control the temperature of the heat transfer fluid.

In some embodiments, in addition to the one or more channels 136, one or more heaters (not shown) may be disposed proximate the substrate support 108 to further facilitate control over the temperature of the substrate support surface 126. The heaters may be any type of heater suitable to provide control over the substrate temperature. For example, the heater may be one or more resistive heaters. In some embodiments the heaters may be disposed above or proximate to the substrate support surface 126. Alternatively, or in combination, in some embodiments, the heaters may be embedded within the substrate support 108. The number and arrangement of the one or more heaters may be varied to provide additional control over the temperature of the substrate 110. For example, in embodiments where more than one heater is utilized, the heaters may be arranged in a plurality of zones to facilitate control over the temperature across the substrate 110, thus providing increased temperature control.

Figure 2:
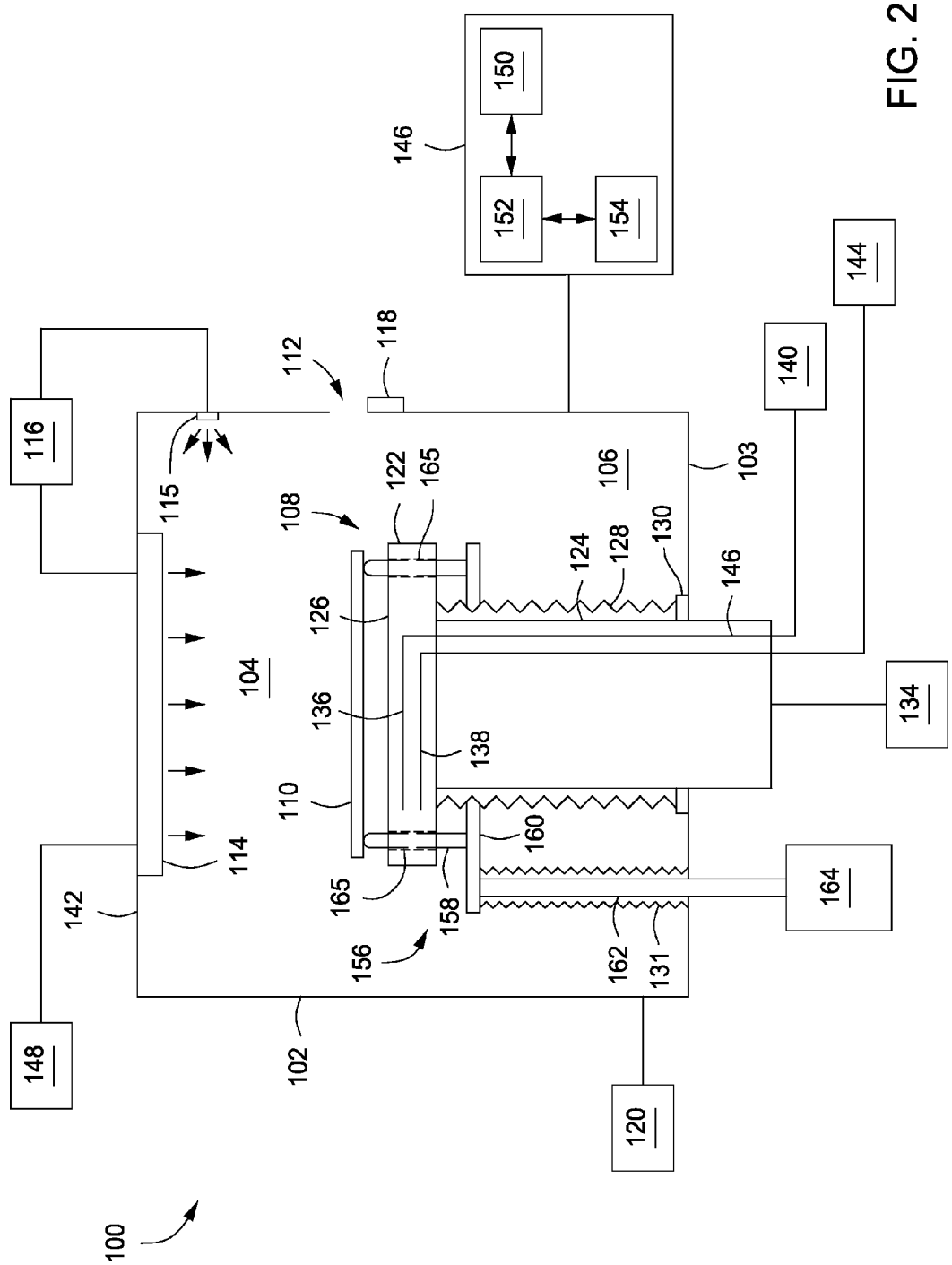

In some embodiments, the support shaft 124 is coupled to a lift mechanism 134 which provides vertical movement of the substrate support 108 between an upper, processing position (as shown in FIG. 1) and a lower, transfer position (shown in FIG. 2). A bellows assembly 128 is disposed about the support shaft 124 and is coupled between the substrate support 108 and a bottom surface 103 of the chamber body 102 to provide a flexible seal that allows vertical motion of the substrate support 108 while preventing loss of vacuum from within the process chamber 100. The bellows assembly 128 also includes a lower bellows flange 130 in contact with an o-ring (not shown) which contacts bottom surface 103 to help prevent loss of chamber vacuum.

A substrate lift 156 may include lift pins 158 mounted on a platform 160 connected to a shaft 162 which is coupled to a lift mechanism 164 (described below) for raising and lowering the lift pins 158 so that the substrate 110 may be placed on or removed from the substrate support 108. The body 122 of the substrate support 108 includes thru-holes 165 to receive the lift pins 158. A bellows assembly 131 is coupled between the substrate lift 156 and bottom surface 103 to provide a flexible seal which maintains the chamber vacuum during vertical motion of the substrate lift 156. In operation, the substrate lift 156 raises the platform 160, causing the lift pins 158 to move through the thru-holes 165 and engage the substrate 110. The lift pins apply an upward force on the substrate 110, causing the substrate 110 to lift from the substrate support 108, for example as depicted in FIG. 2. However, the inventors have observed that in instances where the substrate binds to the substrate support (for example, when excess process byproducts or residues cause the substrate to stick to the substrate support, or when the electrostatic charge clamping the substrate to the support doesn't fully dissipate), the force exerted on the substrate 110 from the plurality of lift pins 158 may damage the substrate if too great a force is applied.

Figure 3:
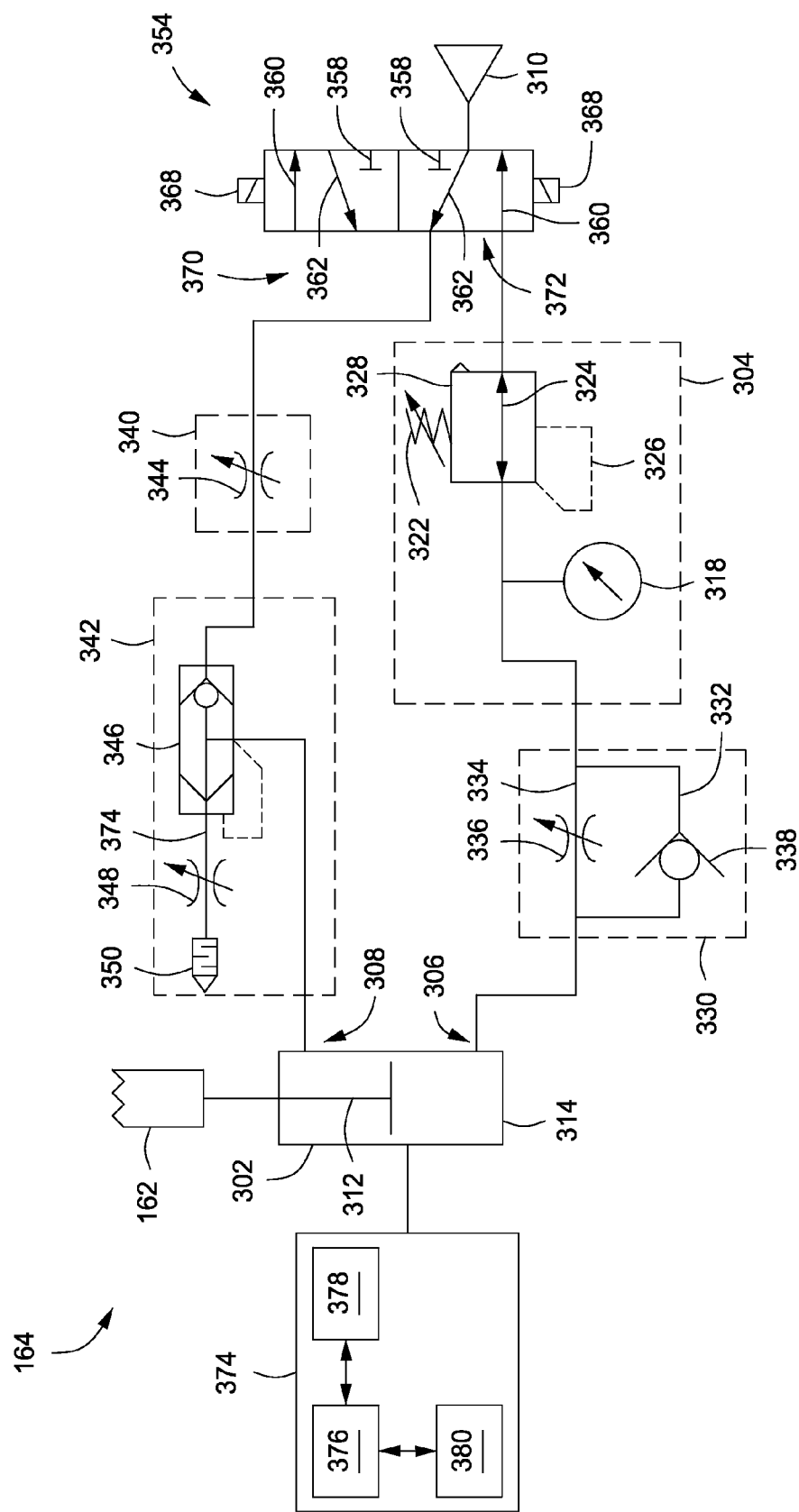
FIGS. 3 and 4 are schematic views of a lift mechanism suitable for use with a substrate lift in accordance with some embodiments of the present invention.

Accordingly, the lift mechanism 164 may provide a reduced force at least during the lifting motion of the lift mechanism 164. In some embodiments, and as described in FIG. 3, the lift mechanism 164 may generally comprise an actuator 302 having a first port 306 for receiving air from an air supply 310 at a first pressure and a pressure regulator 304 coupled to the actuator 302 to reduce the first pressure. The actuator 302 may be any type of suitable actuator 302, for example such as a pneumatic actuator. In such embodiments, the actuator 302 may comprise a cylindrical body 314 housing a piston 312. In operation, as the air supply provides air to the first port 306, the piston 312 extends, or moves from a lower portion of the body 314 towards and upper portion of the body 314, raising the shaft 162 of the substrate lift 156, thereby causing the lift pins 158 to lift the substrate 110 (as depicted in FIG. 2).

In some embodiments, the actuator 302 may further comprise a second port 308 for receiving air from the air supply 310 at a second pressure. In operation, as the air supply 310 provides air to the second port 308, the piston 312 retracts, or moves from the upper portion of the body 314 toward a lower part of the body 314, lowering the shaft 162 of the substrate lift 156, thereby causing the lift pins 158 to lower the substrate 110 to a substrate support 108 (as depicted in FIG. 1). The second air pressure may be any pressure suitable to retract the piston 312, for example about 80 to about 100 psi, which may be the typical air pressure provided in an industrial setting, such as a fab. In some embodiments, the lift mechanism 164 provides reduced pressure, and low force, only during the lifting motion of the lift mechanism 164.

The air supply 310 may be any type of air supply capable of providing air at a suitable pressure to operate the various components of a processing system (e.g. process chamber 100 described above). For example, in some embodiments, the air supply 310 may comprise one or more compressed gas cylinders. In some embodiments, the gas supply may comprise a clean dry air (CDA) system to prevent contaminants or moisture from entering the actuator 302. The air supply 310 may provide the air at any pressure suitable to operate the processing system components. For example, the first pressure supplied by the air supply 310 may be about 80 to about 100 psi.

The pressure regulator 304 may be any type of pressure regulator suitable to reduce the first pressure supplied by the air supply 310. For example, in some embodiments, the pressure regulator 304 may comprise a body 328 housing a two way relief valve 324, a feedback loop 326 and an adjustable output 322 to adjust the pressure. In some embodiments, the adjustable output 322 may be manually or electrically controlled. In some embodiments, the pressure regulator 304 may further comprise a gauge 318 to provide a user with a visual indicator of the air pressure. In operation, the regulator 304 is set to reduce the first pressure provided by the air supply 310 to a predetermined output pressure via the adjustable output 322. The predetermined output pressure may be any pressure suitable to lift a substrate from a substrate support (e.g., as described above) without causing damage to the substrate. In some embodiments, the predetermined output pressure may be less than the second pressure. For example, in some embodiments, the predetermined output pressure may be about 10 to about 25 psi.

In some embodiments, the lift mechanism 164 may comprise a speed exhaust controller 330 to control the speed of the air as it is evacuates from the first port 306 of the actuator 302 to an exhaust 360 during piston 312 retraction. In some embodiments, the speed exhaust controller 330 may comprise a first flow path 334 having an adjustable restriction valve 336 to adjust the flow of air through the speed exhaust controller 330 and a second flow path 332 having a check valve 338 configured to prevent the flow of air from the actuator 302 to the pressure regulator 304. In operation, as the air supply 310 provides air to extend the piston 312, the air travels through first flow path 334 at a restricted flow (set by the adjustable restriction valve 336) and the second flow path 332 of the speed exhaust controller 330. Alternatively, as the air supply 310 provides air to retract the piston 312, air is forced out of the actuator 302 via the first port 306 and the air travels through only the first flow path 334 of the speed exhaust controller 330.

Figure 4:
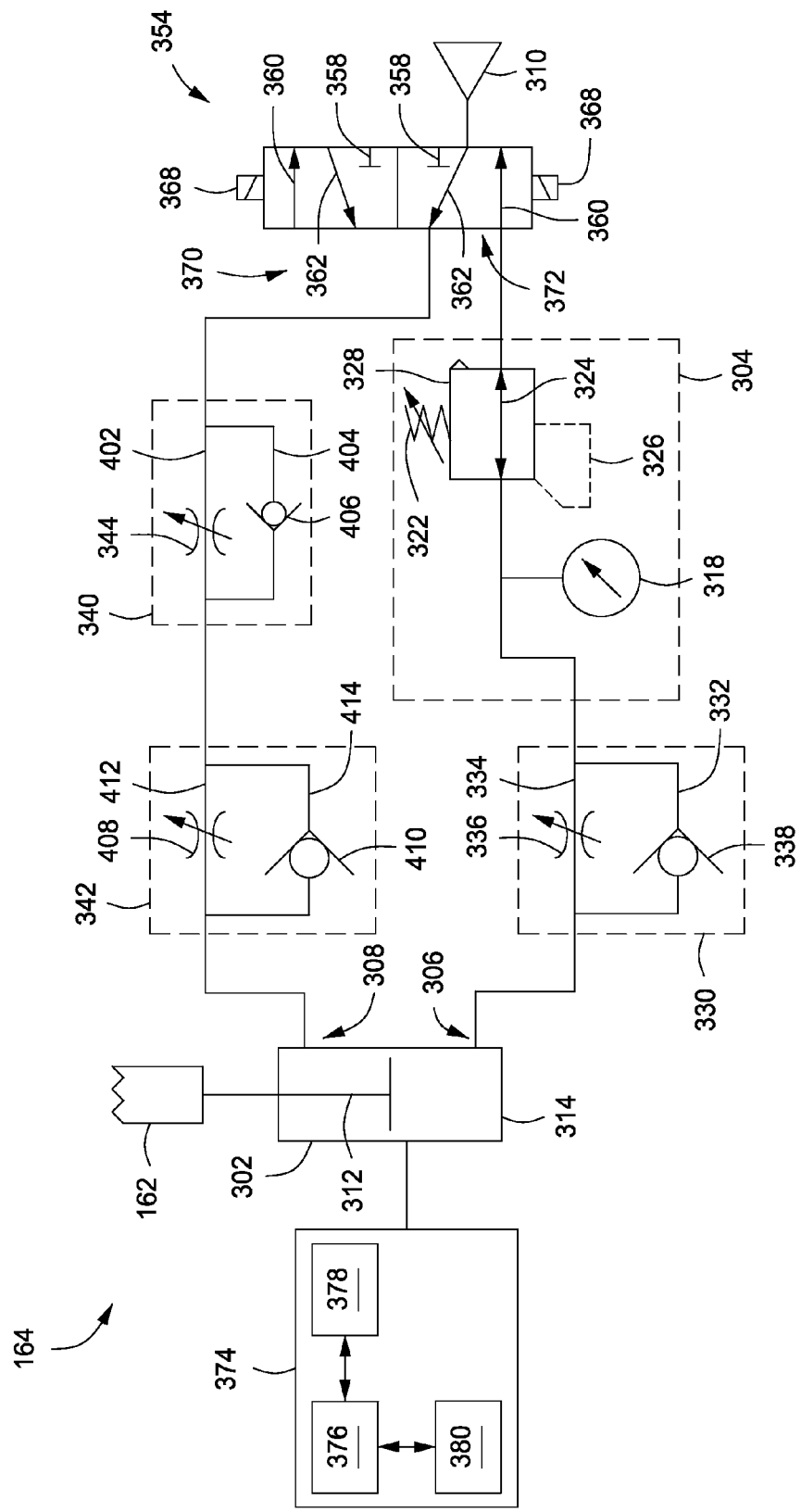

In some embodiments, a speed controller 340 and a speed exhaust controller 342 may be coupled to the actuator 302 to control the speed of the air as it is provided to, or evacuated from, the actuator 302 via the second port 308. In some embodiments, the speed controller 340 may comprise an adjustable restriction valve 344 to adjust the flow of air through the speed controller 340. In some embodiments, the speed controller 340 may additionally comprise a check valve 406 configured to prevent the flow of air from the air supply 310 to the actuator 302, for example, as depicted in FIG. 4. In such embodiments, the speed controller 340 may comprise a first flow path 402 having the adjustable restriction valve 344 and a second flow path 404 having the check valve 338. In operation, as the air supply 310 provides air to the second port 308 to retract the piston 312, the air travels through the first flow path 402 of the speed controller 340 and is restricted by the adjustable restriction valve 344. Alternatively, as the air supply 310 provides air to the first port 306 to extend the piston 312, the air evacuates the actuator 302 via the second port 308 and travels through the first flow path 402 and the second flow path 404 to an exhaust 360.

Referring back to FIG. 3, in some embodiments, the speed exhaust controller 342 may comprise a quick exhaust valve 346 configured to allow the flow of air from the air supply 310 to the actuator 302 and to direct the flow of air from the actuator 302 to an exhaust line 374. In some embodiments an adjustable restriction valve 348 is coupled to the exhaust line 374 to restrict the flow of air as it is exhausted from the quick exhaust valve 346. Alternatively, or in combination, in some embodiments a silencer 350 may be coupled to the exhaust line 374 to reduce a noise level created by the exhausting of the air. In operation, as the air supply 310 provides air to the first port 306 to extend the piston 312, the air evacuates from the actuator 302 via the second port 308 and is directed to the exhaust line 374 via the quick exhaust valve 346.

Alternatively, in some embodiments, the speed exhaust controller 342 may comprise a first flow path 412 having an adjustable restriction valve 408 to adjust the flow of air through the speed exhaust controller 342 and a second flow path 414 having a check valve 410 configured to prevent the flow of air from the actuator 302 to the speed controller 340, as depicted in FIG. 4. In operation, as the air supply 310 provides air to the second port 308 to retract the piston 312, the air travels through the first flow path 412 and the second flow path 414 of the speed exhaust controller 342. Alternatively, as the air supply 310 provides air to the first port 306 to extend the piston 312, the air evacuates the actuator 302 via the second port 308 and travels through the first flow path 412 of the speed exhaust controller 342 to the exhaust 360 and is restricted by the adjustable restriction valve 408.

In some embodiments, the air supply 310 or exhausts 360 may selectively provide air to, or exhaust air from, the first port 306 or second port 308 via a manifold 354. In some embodiments, the manifold 354 may be a two position valve comprising a first half 370 and second half 372, wherein each of the first half 370 and second half 372 comprising a supply port 362, exhaust port 360 and closed port 358. An actuator 368 controls the position of the manifold 354, thereby allowing the air supply 310 and exhausts 360 to be selectively coupled to the first port 306 or second port 308 of the actuator 302.

To facilitate control of the lift mechanism 164, a controller 374 may be provided. In some embodiments, the controller 374 may be the process chamber controller 146. The controller 374 may be one of any form of general-purpose computer processor that can be used in an industrial setting for controlling various chambers and sub-processors. The memory, or computer-readable medium 378 of the CPU 376 may be one or more of readily available memory such as random access memory (RAM), read only memory (ROM), floppy disk, hard disk, or any other form of digital storage, local or remote. The support circuits 380 are coupled to the CPU 376 for supporting the processor in a conventional manner. These circuits include cache, power supplies, clock circuits, input/output circuitry and subsystems, and the like.

In some embodiments, the controller 374 may be configured to receive signals from the lift mechanism 164. For example, in some embodiments, the controller 374 may receive signals indicative of the position of the piston 312, internal pressure of the actuator 302, or the like. In some embodiments, the controller 374 may be configured to halt operation of the lift mechanism 164 to prevent damage to a substrate while lifting the substrate from a substrate support (e.g., as described above). For example, in instances where the substrate binds to the substrate support, the controller 374 may be configured to detect when the lift mechanism has not raised the substrate after the expiration of a period of time. Upon detection of the failure of the lift mechanism 164 to raise the substrate, the controller 374 may halt operation of the lift mechanism 164 and send an error message to a user.

Thus, embodiments of substrate lifts have been provided herein. At least some embodiments of the inventive substrate lift may advantageously provide a low force that prevents damage to a substrate caused by excessive force applied to the substrate via the lift pins.

While the foregoing is directed to embodiments of the present invention, other and further embodiments of the invention may be devised without departing from the basic scope thereof.

The invention claimed is:

1. A substrate lift, comprising:
    a substrate support having a plurality of lift pins movably disposed through the substrate support to selectively raise and lower a substrate;
    an actuator coupled to the plurality of lift pins to control the position of the plurality of lift pins, wherein the actuator has a first port for receiving air at a first pressure to cause the actuator to extend the plurality of lift pins and a second port for receiving air at a second pressure to cause the actuator to retract the plurality of lift pins; and
    a pressure regulator coupled to the actuator to reduce the first pressure of air flowing into the actuator to a magnitude that is less than that of the second pressure.

2. The substrate lift of claim 1, wherein the pressure regulator comprises a gauge.

3. The substrate lift of claim 1, wherein the second pressure is about 80 to about 100 psi.

4. The substrate lift of claim 1, wherein the regulator reduces the first pressure to about 10 to about 25 psi.

5. The substrate lift of claim 1, wherein the air supply is a clean dry air (CDA) air supply.

6. The substrate lift of claim 1, further comprising a first speed exhaust controller coupled to the first port of the actuator, wherein the first speed exhaust controller comprises an adjustable restriction valve to control a flow of air between the pressure regulator and the actuator.

7. The substrate lift of claim 6, wherein the first speed exhaust controller further comprises:
    a first flow path comprising the adjustable restriction valve; and
    a second flow path comprising a check valve configured to allow a flow of air from the pressure regulator to the actuator and to prevent a flow of air from the actuator to the pressure regulator.

8. The substrate lift of claim 1, further comprising:
    a controller coupled to the actuator configured to receive a signal indicative of whether a force exerted on the substrate by the actuator is less than a force required to lift the substrate from the substrate support.

9. The substrate lift of claim 8, wherein the controller is configured to stop the plurality of lift pins from extending and report an error message when the force exerted on the substrate by the actuator is less than a force required to lift the substrate from the substrate support.

10. The substrate lift of claim 1, further comprising:
    a valve coupled to the air supply to selectively provide air to the first port or a second port of the actuator and to selectively exhaust air from the first port or the second port.

11. The substrate lift of claim 10, wherein the valve is a two position valve.

12. The substrate lift of claim 1, further comprising:
    a speed controller having an adjustable restriction valve disposed coupled to the second port to control a flow of air between the air supply and the actuator.

13. The substrate lift of claim 12, wherein the first speed controller further comprises:
    a first flow path comprising the adjustable restriction valve; and
    a second flow path comprising a check valve configured to allow a flow of air from the actuator to an exhaust and to prevent a flow of air from the air supply to the actuator via the second flow path.

14. The substrate lift of claim 1, further comprising a second speed exhaust controller having an adjustable restriction valve coupled to the second port to control a flow of the air between the air supply and the actuator.

15. The substrate lift of claim 14, wherein the wherein the second speed exhaust controller further comprises:
    a first flow path comprising the adjustable restriction valve; and
    a second flow path comprising a check valve configured to allow a flow of air from the air supply to the actuator and to prevent a flow of air from the actuator to an exhaust via the second flow path.

16. The substrate lift of claim 1, further comprising a second speed exhaust controller comprising a shuttle valve configured to allow a flow of gas from the air supply to the actuator and direct a flow of air from the actuator to an exhaust line coupled to the shuttle valve.

17. The substrate lift of claim 16, wherein the second speed exhaust controller further comprises an adjustable restriction valve coupled to the exhaust line to control a flow of air from the actuator to an exhaust.

18. The substrate lift of claim 16, wherein the second speed exhaust controller further comprises a silencer coupled to the exhaust line.

19. The substrate lift of claim 1, wherein the substrate lift is disposed within a process chamber.

* * * * *